(12) United States Patent
Madrid et al.

(10) Patent No.: US 6,777,800 B2
(45) Date of Patent: Aug. 17, 2004

(54) SEMICONDUCTOR DIE PACKAGE INCLUDING DRAIN CLIP

(75) Inventors: Ruben Madrid, Lapu-lapu (PH); Maria Clemens Y. Quinones, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 12 days.

(21) Appl. No.: 10/262,170

(22) Filed: Sep. 30, 2002

(65) Prior Publication Data

US 2004/0063240 A1 Apr. 1, 2004

(51) Int. Cl.[7] ................... H01L 23/48; H01L 23/495; H01L 21/44
(52) U.S. Cl. ................... 257/690; 257/666; 257/693; 438/123; 438/127
(58) Field of Search ................... 257/666, 690, 257/693, 735, 778, 779, 678; 438/106, 112, 127, 611, 612, 123

(56) References Cited

U.S. PATENT DOCUMENTS

| | | |
|---|---|---|
| 5,319,242 A | 6/1994 | Carney et al. |
| 6,133,634 A | 10/2000 | Joshi |
| 6,143,981 A | 11/2000 | Glenn |
| 6,469,384 B2 | 10/2002 | Joshi |
| 6,489,678 B1 | 12/2002 | Joshi |
| 6,624,522 B2 * | 9/2003 | Standing et al. ............ 257/782 |
| 6,674,157 B2 | 1/2004 | Lang |
| 2001/0048116 A1 * | 12/2001 | Standing et al. ............ 257/177 |
| 2002/0066950 A1 | 6/2002 | Joshi |
| 2002/0081772 A1 | 6/2002 | Madrid et al. |
| 2002/0089042 A1 | 7/2002 | Madrid |
| 2002/0100962 A1 | 8/2002 | Joshi |
| 2002/0125550 A1 * | 9/2002 | Estacio ...................... 257/666 |
| 2002/0167075 A1 | 11/2002 | Madrid |
| 2002/0171126 A1 | 11/2002 | Estacio et al. |
| 2003/0025183 A1 * | 2/2003 | Thornton et al. ........... 257/666 |
| 2003/0052408 A1 * | 3/2003 | Quinones et al. .......... 257/737 |
| 2003/0197278 A1 * | 10/2003 | Joshi et al. ................. 257/772 |

OTHER PUBLICATIONS

Fairchild Semiconductor Catalog "High Speed–10 MBit/s Logic Gate Optocouplers," Aug. 27, 2002, pp. 1–11.
Seme Lab Catalog "Metal Gate RF Silicon FET," 1996, pp. 1–2.

* cited by examiner

Primary Examiner—Matthew Smith
Assistant Examiner—Lex H. Malsawma
(74) Attorney, Agent, or Firm—Townsend and Townsend and Crew LLP (57) ABSTRACT

A semiconductor die package including a semiconductor die including a first surface, a second surface, and a vertical power MOSFET having a gate region and a source region at the first surface a drain region at the second surface. A drain clip having a major surface is electrically coupled to the drain region. A gate lead is electrically coupled to the gate region. A source lead is electrically coupled to the source region. A non-conductive molding material encapsulates the semiconductor die. The major surface of the drain clip is exposed through the non-conductive molding material.

14 Claims, 8 Drawing Sheets

SEMICONDUCTOR DIE PACKAGE INCLUDING DRAIN CLIP

BACKGROUND OF THE INVENTION

There are a number of semiconductor die packages. In one example of a semiconductor die package, a semiconductor die is mounted to a lead frame with leads. Wires couple the semiconductor die to the leads. The wires, the semiconductor die and then the most of the lead frame (except for the leads that extend outward) are then encapsulated in a molding material. The molding material is then shaped. The formed semiconductor die package includes a molded body that has leads extending laterally away from the molded body. The semiconductor die package can be mounted onto a circuit board.

While such semiconductor packages are useful, improvements could be made. For example, it would be desirable if the thickness of a semiconductor die package could be reduced. As consumer electronics (e.g., cell phones, laptop computers, etc.) continue to decrease in size, there is an ever increasing demand for thinner electronic devices and thinner electronic components. In addition, it would be desirable to improve the heat dissipation properties of a semiconductor die package. For example, power semiconductor devices such as vertical MOSFETs (metal oxide field effect transistors) can generate a significant amount of heat. For high output power applications (e.g., more than 60 Watts), special packaging is required to remove heat from the power transistor to prevent overheating. Overheating can also degrade the operational characteristics of a power transistor.

Embodiments of the invention address these and other problems individually and collectively.

SUMMARY OF THE INVENTION

Embodiments of the invention are directed to semiconductor die packages and methods for making semiconductor die packages.

One embodiment of the invention is directed to a semiconductor die package comprising: (a) a semiconductor die comprising a first surface, a second surface, and a vertical power MOSFET having a gate region and a source region at the first surface, and a drain region at the second surface; (b) a drain clip having a major surface and being electrically coupled to the drain region; (c) a gate lead electrically coupled to the gate region; (d) a source lead electrically coupled to the source region; and (e) a non-conductive molding material encapsulating the semiconductor die, wherein the major surface of the drain clip is exposed through the non-conductive molding material.

Another embodiment of the invention is directed to a semiconductor die package comprising: (a) a semiconductor die comprising a first surface, a second surface, and a vertical power MOSFET having a gate region and a source region at the first surface, and a drain region at the second surface; (b) a drain clip having a major surface and being electrically coupled to the drain region; (c) a drain lead electrically coupled to an end of the drain clip; (d) a gate lead electrically coupled to the gate region; (e) a source lead structure including at least one source lead and a protruding region having a major surface, and a die attach surface opposite the major surface of the source lead structure, the die attach surface being electrically coupled to the source region; and (f) a non-conductive molding material encapsulating the semiconductor die, wherein the major surface of the drain clip is exposed through the non-conductive molding material.

Another embodiment of the invention is directed to a method for making a semiconductor die package, the method comprising: (a) providing a semiconductor die comprising a first surface, a second surface, and a vertical power MOSFET having a gate region and a source region at the first surface, and a drain region at the second surface; (b) attaching a source lead structure to the source region and a gate lead to the gate region; (c) attaching a drain clip having a major surface to the drain region; (d) molding an molding material around the semiconductor die, whereby the major surface is exposed through the molding material.

These and other embodiments of the invention are described in further detail below.

DETAILED DESCRIPTION

Embodiments of the invention are directed to semiconductor die packages. They can be made in any suitable manner. For example, in some embodiments, a semiconductor die with solder bumps on its front side can be flipped over and attached to a lead frame. The lead frame may be a copper lead frame. In some embodiments, the bumped semiconductor die includes one or more gate solder bumps and source solder bumps. A gate solder bump can be attached to an isolated gate lead structure of the lead frame, while the source solder bumps are attached to one or more source lead structures in the lead frame. The gate and source lead structures eventually form gate and source connections for a MOSFET in the semiconductor die.

The back side of the semiconductor die, which corresponds to the drain region of the MOSFET, is electrically coupled to a drain clip. The drain clip can be attached to the back side of the semiconductor die using solder paste. The drain clip interconnects the back side of the semiconductor die to a drain lead structure including drain leads. Solder paste (e.g., a solder paste alloy) can be used to electrically connect the drain clip to the drain lead structure. The drain clip, the solder, and the drain lead structure can provide a drain connection from the back side of the semiconductor die to the front side of the semiconductor die.

The source lead structure in the semiconductor die package may include a protruding portion with a major surface. The source leads of the source lead structure, the gate lead of the gate lead structure, and the major surface of the source lead structure are exposed through a molding material. These surfaces may be within the same plane and may also be co-planar with the surface of the drain leads in the drain lead structure. At the opposite side of the semiconductor die, a major surface of a drain clip is exposed through the molding material.

Embodiments of the invention have a number of advantages. First, the semiconductor die packages according to embodiments of the invention can have a low overall package resistance (i.e., a low RdSon). In embodiments of the invention, the drain region in the semiconductor die may be electrically coupled to a drain clip, and the drain clip may be electrically connected to a drain lead structure with drain leads. A source lead structure and a gate lead structure can be respectively coupled to the source region and the gate region in the semiconductor die. Substantially direct electrical connections are made to the gate, source, and drain regions in the semiconductor die, and this reduces the overall package resistance. Second, the semiconductor die package can accommodate large semiconductor dies, or small semiconductor dies (e.g., up to 4 mils thick) while providing reliable interconnections. Third, embodiments of the invention are thin. For example, in embodiments of the invention, the semiconductor die package can be as thin as 0.75 mm or less. Fourth, embodiments of the invention also exhibit improved thermal performance. The improved thermal performance can be achieved, since a drain clip is exposed and is coplanar with the surface of a molding material in the semiconductor die package. This provides for a natural heat sink in the semiconductor die package. In addition, in embodiments of the invention, the source and the drain are exposed at the same time from the top and bottom of the package in one assembly process. The exposed major surfaces of the drain clip and the source lead structure can serve as a natural cooling means to cool off the semiconductor die when it is operating. Fifth, embodiments of the invention can also be manufactured in high volumes. Flip chips, lead frames, a drain clip, and a molding material can be used in embodiments of the invention to facilitate high production volumes.

FIGS. 1–7 illustrate embodiments of the invention. In FIGS. 1–7, like numerals designate like elements.

Figure 1:
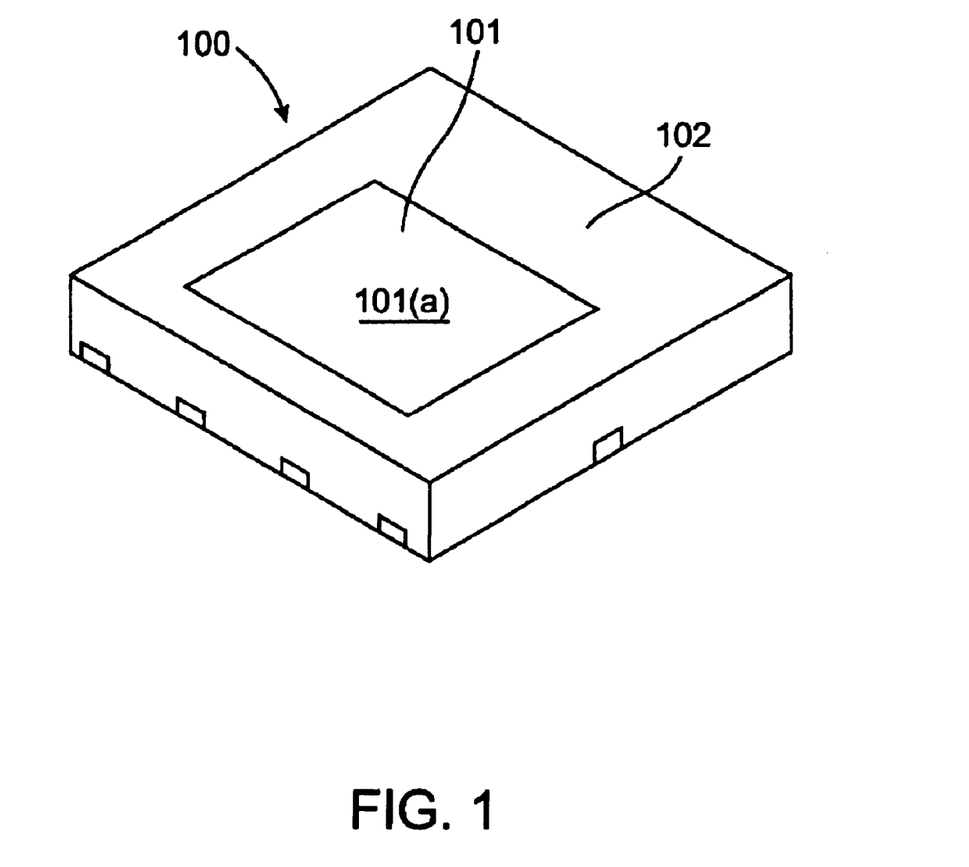
FIG. 1 shows a perspective view of a semiconductor die package. A major surface of a drain clip is exposed through the top side of the package and is parallel to a surface of a molding material.

FIG. 1 is a top, perspective view of a semiconductor die package 100 according to an embodiment of the invention. The semiconductor die package 100 includes a drain clip 101 and a molding material 102 that is molded around the drain clip 101. As shown in FIG. 1, a major surface 101(a) of the drain clip 101 is exposed through the molding material 102. The molding material 102 may comprise any suitable moldable dielectric material that is known in the art.

The molding material 102 protects the semiconductor die (not shown) inside of the package 100 from any contamination or corrosion from the surrounding environment. In embodiments of the invention, the molding material 102 may first be molded, and then shaped. After molding, the molding material 102 can be sawn off and separated from other semiconductor die packages so that the resulting semiconductor die package is in a block form. Alternatively, the molding material 102 may be molded individually without sawing.

The semiconductor die 108 may include any suitable semiconductor device. Suitable devices include vertical power transistors. Vertical power transistors include VDMOS transistors. A VDMOS transistor is a MOSFET that has two or more semiconductor regions formed by diffusion. It has a source region, a drain region, and a gate region. The device is vertical in that the source region and the drain region are at opposite surfaces of the semiconductor die. The gate region may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. In embodiments of the invention, the front side of a semiconductor die can comprise a source region and a gate region, while the back side of the semiconductor die can comprise the drain region.

Figure 2:
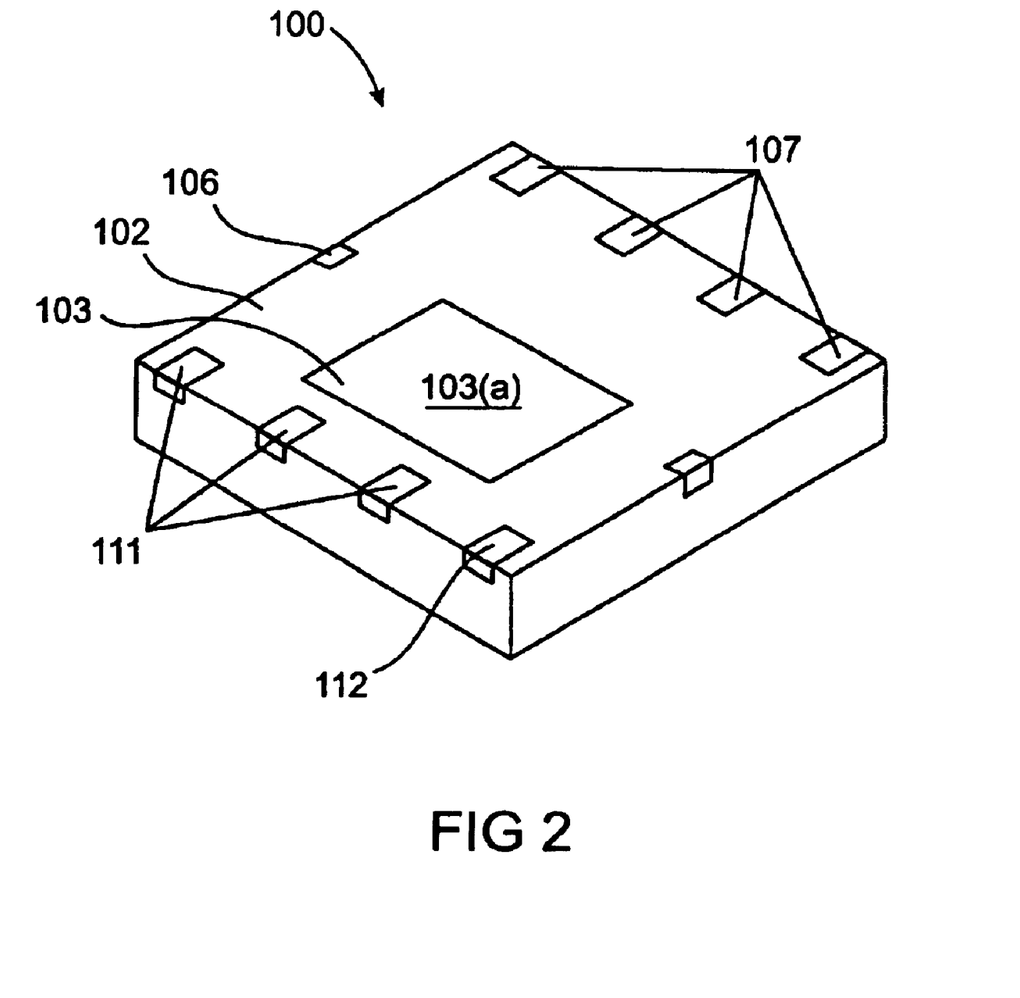
FIG. 2 shows a perspective bottom view of a semiconductor die package. A major surface of a source lead structure, a surface of a gate lead, and surfaces of source leads are exposed through a molding material.

FIG. 2 shows the bottom part of a semiconductor die package 100. The semiconductor die package 100 includes drain leads 107. The drain leads 107, and the gate lead 112 and the source leads 111 are at opposite sides of the semiconductor die package 100 in the illustrated embodiment. A major surface 103(a) of a source lead structure 103 is exposed through the molding material 102. The drain leads 107 are also exposed through the molding material 102. As shown in FIG. 2, the drain leads 107, the gate lead 112, and the source leads 111 do not extend beyond the side surfaces of the molding material 102. This results in a more compact semiconductor die package.

Tie bar regions 106 are between the source and gate leads 111, 112, and the drain leads 107. When the tie bar regions 106 are uncut, the tie bar regions 106 connect a lead frame containing source and gate leads 111, 112 and drain leads 107 to other lead frames in an array of lead frames. The tie bar regions 106 serve to support a lead frame before and during package assembly.

Figure 3:
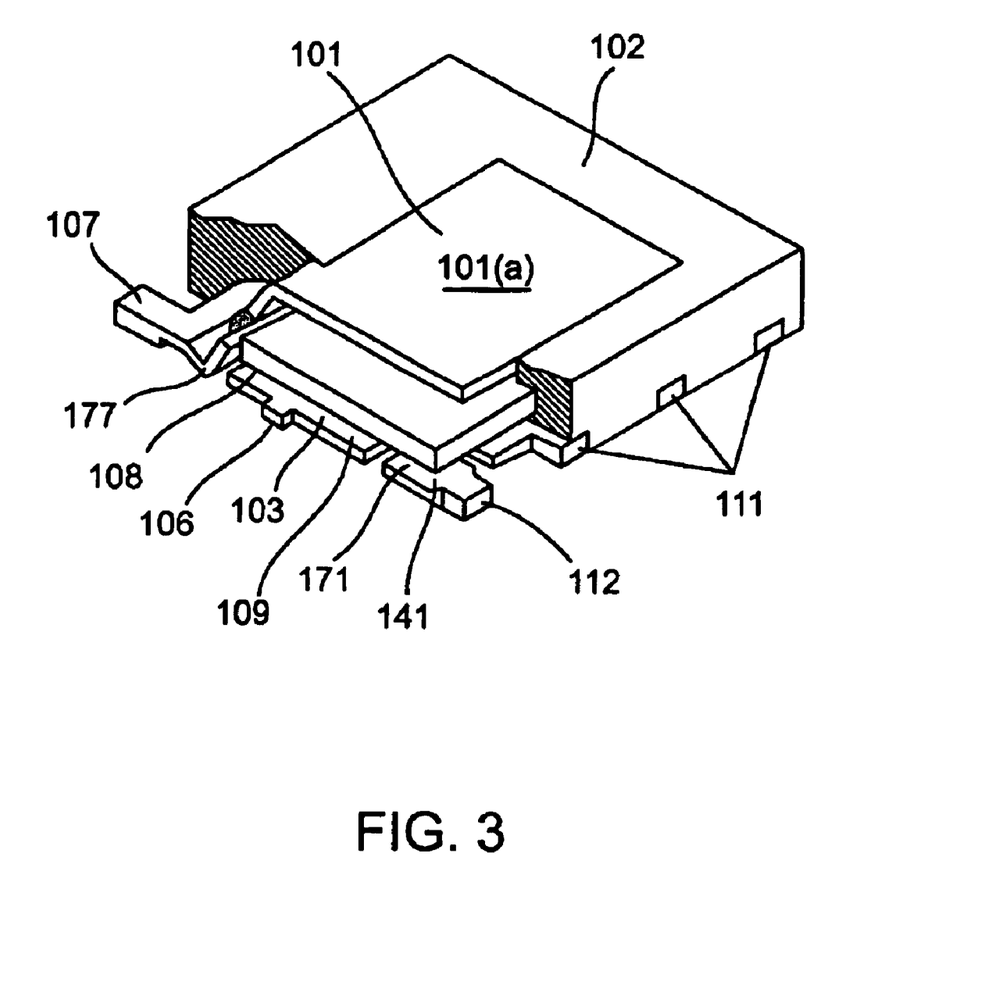
FIG. 3 shows a perspective three dimensional view of a semiconductor die package with part of the molding material partially removed showing a molded assembled part.

FIG. 3 shows an assembled cut-away top view of a semiconductor die package 100 according to an embodiment of the invention. A semiconductor die 108 is attached to a die attach surface 109 of a source lead structure 103. The source lead structure 103 also includes a tie bar region 106. A gate lead structure 171 with a gate lead 112 is attached to the gate region (not shown) of the semiconductor die 108 through a solder bump 141. A drain clip 101 is attached to the semiconductor die 108 through a layer of solder (not shown). The drain clip 101 has a major surface 101(a). A drain lead structure 177 including drain leads 107 is also attached to the drain clip 101 through a layer of solder. Source leads 111 are shown as being exposed at a side of the semiconductor die package 100.

Figure 4:
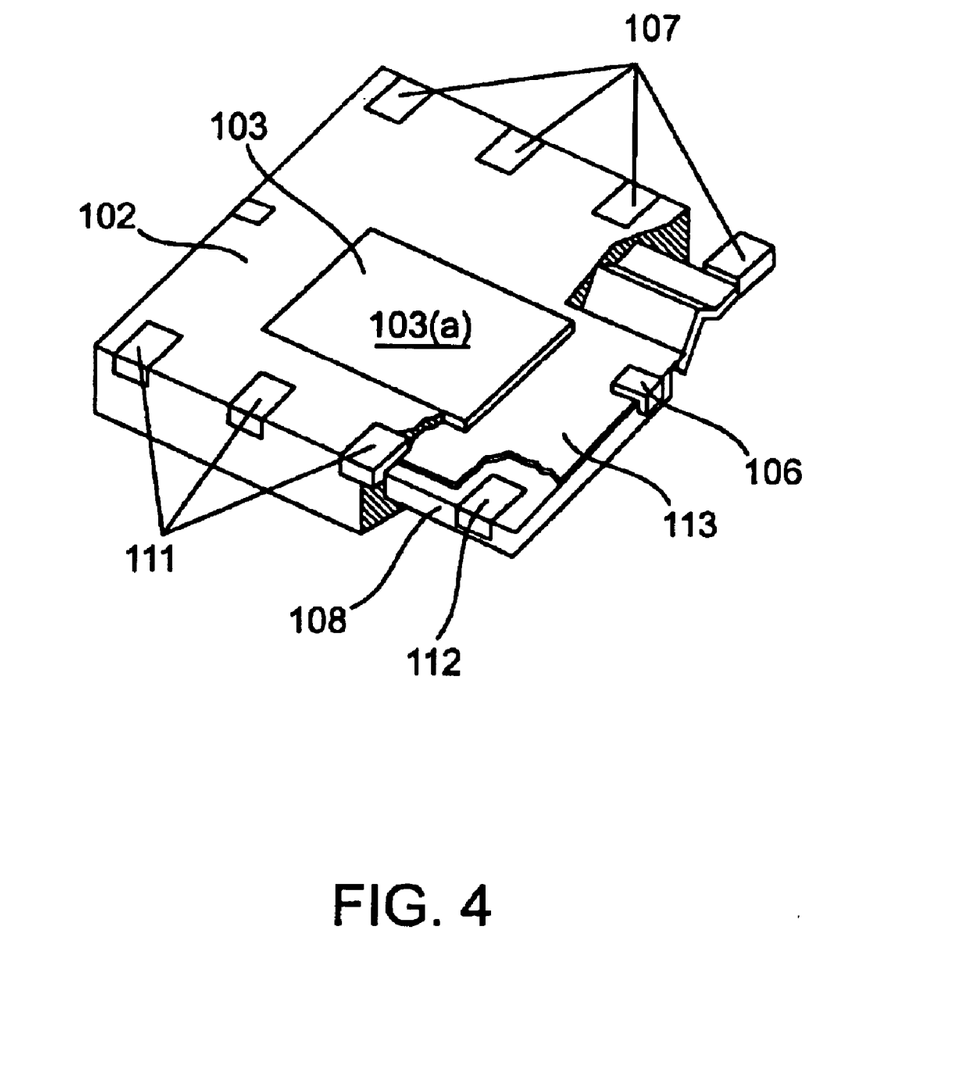
FIG. 4 shows a perspective three dimensional view of a semiconductor die package with part of the molding material partially removed showing a molded assembled part.

FIG. 4 shows an assembled cut-away bottom view of a semiconductor die package 100. The bottom, cut-away portion shows the exposed major surface 103(a) of the source lead structure 103. The major surface 103(a) can be directly coupled to a printed circuit board (PCB) (not shown). The surfaces of the drain leads 107 are shown as being co-planar with the surfaces of the source leads 111 and the gate lead 112, as well as the major surface 103(a).

As shown in FIG. 4, the major surface 103(a) is part of a protruding portion of the source lead structure 103 that protrudes from an adjacent surface 113. The adjacent surface 113 can be formed by etching. In the embodiment shown in FIG. 4, the lead frame that is used to form the gate lead structure and the source lead structure is partially-etched (e.g., half-etched) to allow for a molding material to flow during molding. The partially etched area provides enough area for a mold compound to flow and hold the assembled die package in tact and protected after molding. Partial etching can be performed using photolithography and etching processes that are known in the art. For example, a patterned photoresist layer may be formed on desired areas of a lead frame. The lead frame can then be etched (using, for example, wet or dry etching) to a predetermined depth, so that the lead frame is partially etched in some regions.

Figure 5:
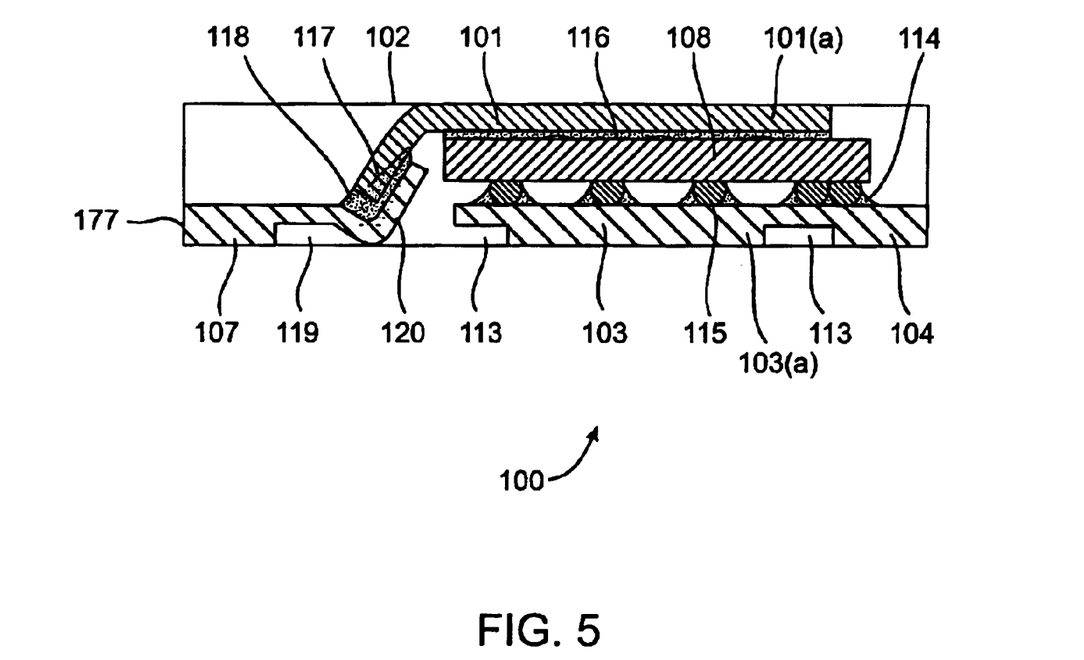
FIG. 5 shows a side cross-sectional view of a semiconductor die package according to an embodiment of the invention.

FIG. 5 shows a side, cross-sectional view of a semiconductor die package according to an embodiment of the invention. As shown in FIG. 5, the drain clip 101 is bent at about a 45 degree angle and has a bent portion 117. This drain clip 101 is electrically coupled to the backside of the semiconductor die 108 with a layer of eutectic solder paste 116. The drain clip 101 has a major surface that is exposed through the molding material 102. The drain clip 101 is electrically coupled with the drain lead structure 177 which has a bent portion 120 that forms a V-shape with a main portion of the drain clip 101. Eutectic solder paste 118 connects the drain clip 101 to the drain lead structure 120. The drain lead structure 120 is partially-etched at reference numeral 119 to allow for the bending of the drain clip 101. The bottom portion of the source lead structure 103 also includes a partially etched region 113. The purpose of the partially-etched source lead structure 103 is to allow the molding material to flow and hold the semiconductor die package 100 intact and protected. The footprint of the semiconductor die package 100 is shown by the reference numerals 104, 107. Flip chip solder bumps 115 and reflowed solder paste 114 electrically couple the source lead structure 103 and the semiconductor die 108 together.

Figure 6:
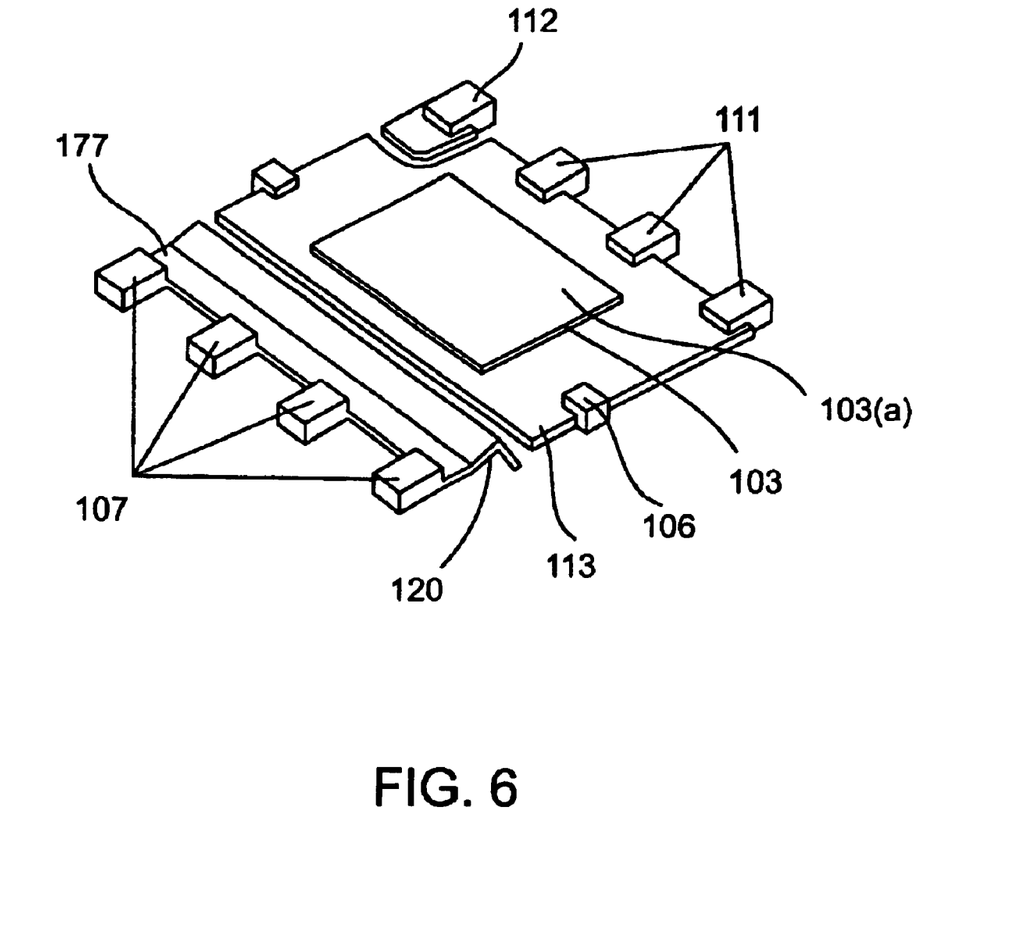
FIG. 6 shows a drain lead, a source lead structure, and a gate lead.

FIG. 6 shows a detailed design of a lead frame structure. The isolated gate lead 112 is partially-etched to provide enough area for a molding material to flow over it. The source leads 111 are substantially coplanar with the major surface 103(a) of the source lead structure 103 and can also be formed using a partial etching process. The bottom part of the lead frame is partially etched at a region where the adjacent surface 113 is located. The partially-etched region will allow the molding material to flow during molding. The drain lead structure 177 has drain leads 107 and a bent portion 120. The bent portion 120 is where the drain lead structure 177 couples to the drain clip (not shown). The drain leads 107 can also be formed by partial etching.

Figure 7:
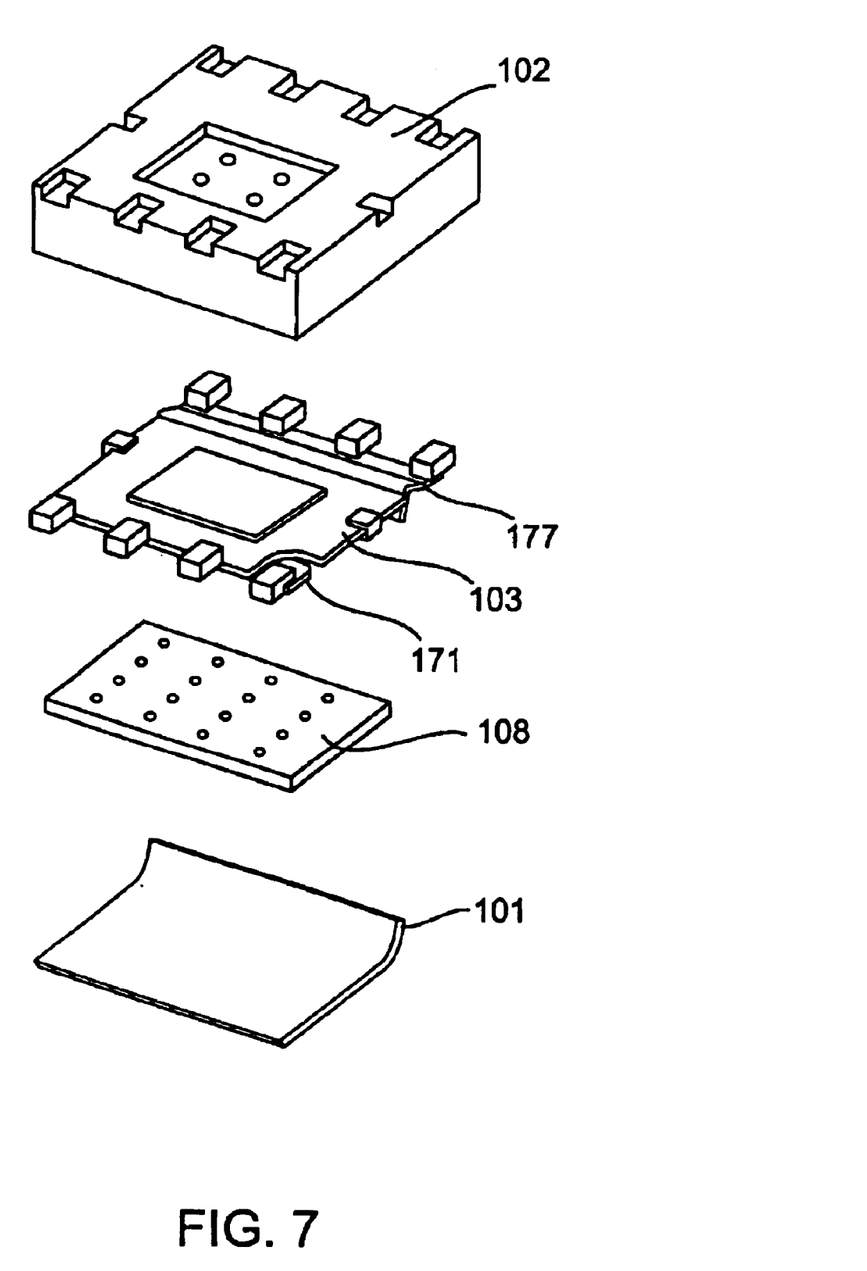
FIG. 7 shows an exploded view of a semiconductor die package.

FIG. 7 shows an exploded view of a semiconductor die package according to an embodiment of the invention. The molding material 102 is shown in the final assembly, which holds the various other components in the semiconductor die package together. As shown, the metallized drain lead structure 177 and the source lead structure 103 serve as the drain and source terminals of the semiconductor die package. As shown in FIG. 7, the semiconductor die 108 is bumped with solder and this is directly attached to the source lead structure 103. The drain clip 101 can be a shaped copper sheet that connects the drain region of the semiconductor die 108 to the drain lead structure 177. The end part of the drain clip 101 is bent at a 45 degree angle to match the angular bend of the drain lead structure 177. The angular parts of both the drain lead structure 177 and the drain clip 101 are electrically coupled using solder paste. Although 45 degree bend angles are described above, it is understood that the drain lead structure 177 and the drain clip 101 can have bend angles of any appropriate value.

The semiconductor die packages according to embodiments of the invention may be of any suitable size. For example, the package size may be smaller than 2×2 mm$^2$, or could be larger than 20×20 mm$^2$. Preferably, the semiconductor die packages according to embodiments of the invention are preferably cubic in nature. They can sometimes be referred to as "flip chip quad packs."

The semiconductor die packages according to embodiments of the invention may be manufactured according to any suitable method. In some embodiments, the method comprises providing a semiconductor die comprising a first surface, a second surface, and a vertical power MOSFET having a gate region and a source region at the first surface, and a drain region at the second surface. Then, a source lead structure is attached to the source region and a gate lead to the gate region. A drain clip having a major surface is also attached to the drain region. A molding material is molded around the semiconductor die, whereby the major surface is exposed through the molding material.

Figure 8:
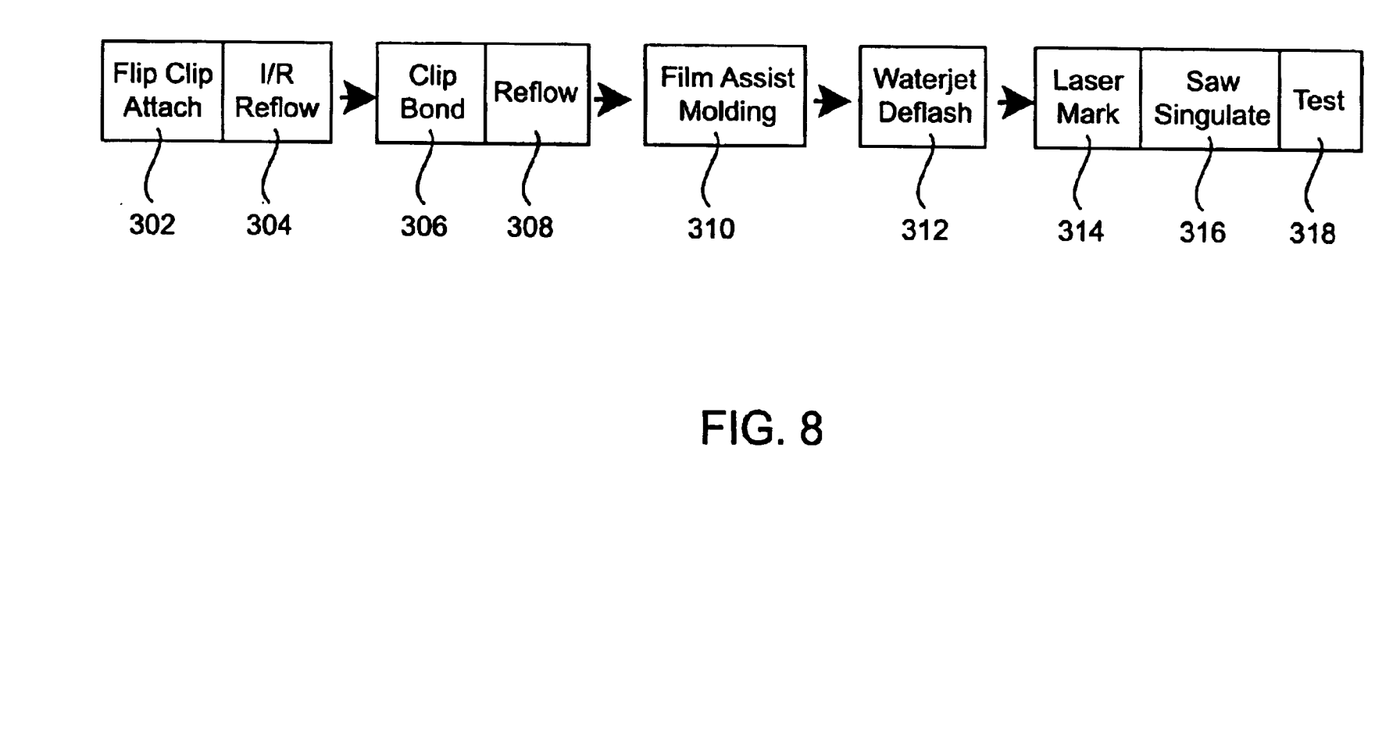
FIG. 8 shows a block diagram of an exemplary method for manufacturing semiconductor die packages according to embodiments of the invention.

An exemplary process flow is shown in FIG. 8. As shown in FIG. 8, a semiconductor die with solder bumps is attached to a lead frame (including what will be the source lead structure, the gate lead structure, and the drain lead structure) in the semiconductor die package using a flip chip die attach process (step 302). The lead frame may be in an array of lead frames. Prior to solder bump attach, the lead frame may be partially etched in desired regions (as described above), and a portion of the drain lead structure in the lead frame may be bent. Then, an infrared (IR) reflow process (step 304) is performed to reflow the solder bumps and establish an electrical connection between the semiconductor die and the source lead structure.

A drain clip is then bonded to the semiconductor die (step 306). The drain clip and/or the semiconductor die may contain a layer of solder or an array of solder bumps. The drain clip can also be bonded to the drain lead structure in the lead frame with solder. The drain clip can also be bonded to the drain lead structure with solder. These components may then be bonded together, and the solder may be subjected to a reflow process (step 308).

A film assisted molding process can then be used to mold a molding material around the semiconductor die, the lead frame structure and the drain clip. The film may be, for example, a piece of tape that is taped to the major surface of the drain clip. The tape prevents molding material from being deposited on the major surface of the drain clip. A molding material may be molded around the semiconductor die, the drain clip, and the lead frame structure while the tape is on the drain clip. Excess molding material may be removed from the side of the semiconductor die opposite the drain clip. A waterjet deflash process (step 312) may be used to remove excess molding material (e.g., on a gate lead structure). Then, the molding material may harden. After molding and deflash, the tape may be removed.

A laser marking process may be used to mark the resulting product (step 314) The tie bars (as well as connections to the source leads, gate lead, and drain leads) that hold the lead frame together with other lead frames can be sawed, and the packages in an array can be singulated (step 316). The final form factor for the package after singulation can be square in that all sides have leads within the edges of the molding material. Then, the individual semiconductor die packages can be tested (step 318).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. For example, many embodiments described above include a drain clip and a drain lead structure as separate elements. In other embodiments, the drain clip could include drain leads so that a separate drain lead structure would not be necessary in other embodiments.

What is claimed is:

1. A semiconductor die package comprising:
   (a) a semiconductor die comprising a first surface, a second surface, and a vertical power MOSFET having a gate region and a source region at the first surface, and a drain region at the second surface;
   (b) a drain clip having a major surface and being electrically coupled to the drain region;
   (c) a gate lead electrically coupled to the gate region;
   (d) a source lead electrically coupled to the source region; and
   (e) a non-conductive molding material encapsulating the semiconductor die, wherein the major surface of the drain clip is exposed through the non-conductive molding material,
   wherein the molding material has a ton surface and a bottom surface, wherein the top surface is substantially coplanar with the major surface of the drain din and wherein the bottom surface is substantially coplanar with a surface of the sate lead and a surface of the source lead.

2. The semiconductor die package of claim 1 further comprising a drain lead electrically coupled to an end of the drain clip, wherein at least a surface of the drain lead is substantially coplanar with a surface of the gate lead and a surface of the source lead.

3. The package of claim 1 wherein the drain clip comprises copper.

4. A semiconductor die package comprising:
   (a) a semiconductor die comprising a first surface, a second surface, and a vertical power MOSFET having a gate region and a source region at the first surface, and a drain region at the second surface;
   (b) a drain din having a major surface and being electrically coupled to the drain region;
   (c) a gate lead electrically coupled to the gate region;
   (d) a source lead electrically coupled to the source region; and
   (e) a non-conductive molding material encapsulating the semiconductor die, wherein the major surface of the drain clip is exposed through the non-conductive molding material, and wherein the package includes a source lead structure, and wherein the source lead structure includes a die attach pad, and wherein the semiconductor die is attached to the die attach pad.

5. A semiconductor die package comprising:
   (a) a semiconductor die comprising a first surface, a second surface, and a vertical power MOSFET having a gate region and a source region at the first surface; and a drain region at the second surface;
   (b) a drain clip having a major surface and being electrically coupled to the drain region;
   (c) a gate lead electrically coupled to the gate region;
   (d) a source lead electrically coupled to the source region; and
   (e) a non-conductive molding material encapsulating the semiconductor die, wherein the major surface of the drain clip is exposed through the non-conductive molding material, wherein the source lead is part of a source lead structure having a major surface, and wherein the molding material has a top surface and a bottom surface, wherein the top surface is substantially coplanar with the major surface of the drain clip and wherein the bottom surface is substantially coplanar with a surface of the gate lead, a surface of the source lead, and the major surface of the source lead structure, and wherein the major surface of the source lead structure and the major surface of the drain clip form exterior surfaces of the semiconductor die package.

6. The package of claim 5 wherein the drain clip comprises copper.

7. A semiconductor die package comprising:
   (a) a semiconductor die comprising a first surface, a second surface, and a vertical power MOSFET having a gate region and a source region at the first surface, and a drain region at the second surface;
   (b) a drain clip having a major surface and being electrically coupled to the drain region;
   (c) a drain lead electrically coupled to an end of the drain clip;
   (d) a gate lead electrically coupled to the gate region;
   (e) a source lead structure including at least one source lead and a protruding region having a major surface, and a die attach surface opposite the major surface of the source lead structure, the die attach surface being electrically coupled to the source region; and
   (f) a non-conductive molding material encapsulating the semiconductor die, wherein the major surface of the drain clip is exposed through the non-conductive molding material.

8. The semiconductor die of claim 7 wherein a surface of the gate lead, a surface of the source lead, and the major surface of the source lead structure are substantially coplanar and are exposed through the molding material.

9. The semiconductor die of claim 7 wherein the drain clip comprises copper.

10. A method for making a semiconductor die package, the method comprising:
    (a) providing a semiconductor die comprising a first surface, a second surface, and a vertical power MOSFET having a gate region and a source region at the first surface, and a drain region at the second surface;
    (b) attaching a source lead structure to the source region and a gate lead to the gate region;
    (c) attaching a drain clip having a major surface to the drain region;
    (d) molding a molding material around the semiconductor die, whereby the major surface is exposed through the molding material,
    wherein in (b) a source lead is part of the source lead structure and the source lead structure and the gate lead are part of a lead frame structure.

11. The method of claim 10 wherein the source lead structure includes a die attach surface.

12. The method of claim 11 wherein the source lead structure is formed by etching an area around the die attach surface.

13. The method of claim 10 further comprising attaching a drain lead to the drain clip using solder.

14. The method of claim 10 wherein the drain clip comprises copper.

* * * * *

UNITED STATES PATENT AND TRADEMARK OFFICE
CERTIFICATE OF CORRECTION

PATENT NO. : 6,777,800 B2
DATED : August 17, 2004
INVENTOR(S) : Madrid et al.

It is certified that error appears in the above-identified patent and that said Letters Patent is hereby corrected as shown below:

<u>Column 7,</u>
Line 21, delete "ton" and substitute therefor, -- top --.
Lines 23 and 39, delete "din" and substitute therefor, -- clip --.
Line 25, delete "sate" and substitute therefor, -- gate --.

Signed and Sealed this

Nineteenth Day of April, 2005

JON W. DUDAS
*Director of the United States Patent and Trademark Office*